(12) United States Patent
Koreeda et al.

(10) Patent No.: US 11,159,139 B2
(45) Date of Patent: Oct. 26, 2021

(54) ELASTIC WAVE DEVICE AND METHOD OF MANUFACTURING THE SAME

(71) Applicant: Murata Manufacturing Co., Ltd., Nagaokakyo (JP)

(72) Inventors: Toshishige Koreeda, Nagaokakyo (JP); Hijiri Sumii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1042 days.

(21) Appl. No.: 15/673,442

(22) Filed: Aug. 10, 2017

(65) Prior Publication Data

US 2017/0366158 A1 Dec. 21, 2017

Related U.S. Application Data

(63) Continuation of application No. PCT/JP2016/055244, filed on Feb. 23, 2016.

(30) Foreign Application Priority Data

Mar. 16, 2015 (JP) .............................. JP2015-051813

(51) Int. Cl.
*H03H 9/25* (2006.01)
*H01L 41/053* (2006.01)
(Continued)

(52) U.S. Cl.
CPC ............ *H03H 9/0222* (2013.01); *H03H 3/08* (2013.01); *H03H 9/059* (2013.01); *H03H 9/1071* (2013.01)

(58) Field of Classification Search
CPC ........ H03H 9/0222; H03H 3/08; H03H 9/059; H03H 9/1071
(Continued)

(56) References Cited

U.S. PATENT DOCUMENTS

2004/0100164 A1* 5/2004 Murata .................. H01L 24/97
310/348
2010/0277035 A1 11/2010 Kudo et al.
(Continued)

FOREIGN PATENT DOCUMENTS

JP 2002-330049 A 11/2002
JP 2007-208665 A 8/2007
(Continued)

OTHER PUBLICATIONS

Official Communication issued in International Patent Application No. PCT/JP2016/055244, dated May 17, 2016.
Official Communication issued in Korean Patent Application No. 10-2017-7025424, dated Aug. 21, 2018.

*Primary Examiner* — Bryan P Gordon
(74) *Attorney, Agent, or Firm* — Keating & Bennett, LLP

(57) ABSTRACT

An elastic wave device includes an elastic wave element including a piezoelectric substrate with a first main surface and a second main surface that face each other, an IDT electrode disposed on the second main surface of the piezoelectric substrate, a support disposed on the second main surface of the piezoelectric substrate so as to surround the IDT electrode in plan view, and a cover that is disposed on the support and seals the IDT electrode together with the support and the piezoelectric substrate, a mounting substrate above which the elastic wave element is mounted, and a sealing resin that is disposed on the side of the side of the upper surface of the mounting substrate and seals the elastic wave element. A thickness of the mounting substrate is less than a thickness of the sealing resin that corresponds to a distance from a surface of the sealing resin in contact with the upper surface of the mounting substrate to a surface of the sealing resin on an opposite side of the mounting substrate.

17 Claims, 4 Drawing Sheets

(51) Int. Cl.
  *H03H 9/02*  (2006.01)
  *H03H 3/08*  (2006.01)
  *H03H 9/10*  (2006.01)
  *H03H 9/05*  (2006.01)

(58) Field of Classification Search
  USPC .................... 310/340, 344, 348, 349, 313 R
  See application file for complete search history.

(56) References Cited

U.S. PATENT DOCUMENTS

| | | | | |
|---|---|---|---|---|
| 2014/0217581 A1* | 8/2014 | Sumii | .................... | H01L 23/315 |
| | | | | 257/737 |
| 2015/0008789 A1* | 1/2015 | Iwamoto | .............. | H03H 9/0523 |
| | | | | 310/313 R |
| 2015/0028966 A1* | 1/2015 | Iwamoto | ................ | H03H 9/725 |
| | | | | 333/133 |
| 2015/0061466 A1* | 3/2015 | Kimura | .................... | H03H 3/10 |
| | | | | 310/365 |
| 2018/0131345 A1* | 5/2018 | Fukuda | .................... | H03H 9/25 |

FOREIGN PATENT DOCUMENTS

| | | | | |
|---|---|---|---|---|
| JP | 2010-136143 A | 6/2010 | | |
| JP | 2010136143 | * 6/2010 | .............. | H03H 9/26 |
| JP | 2010-278971 A | 12/2010 | | |
| JP | 5077357 B2 | 11/2012 | | |

\* cited by examiner

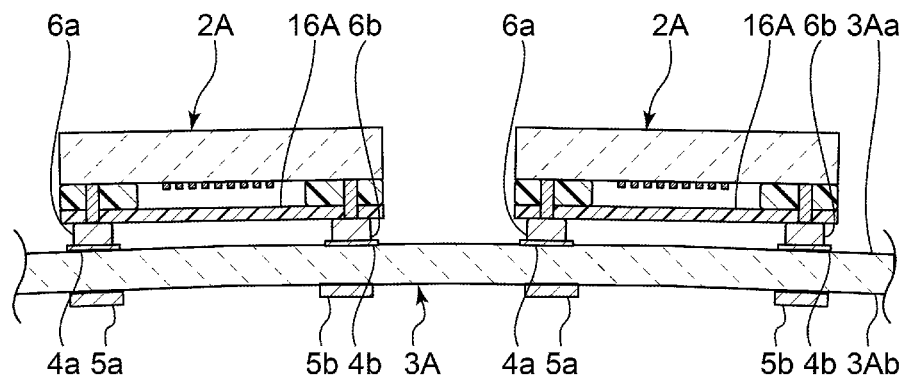
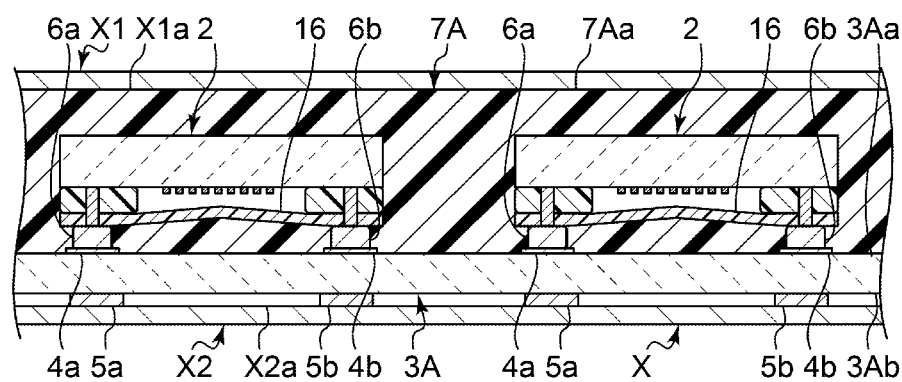
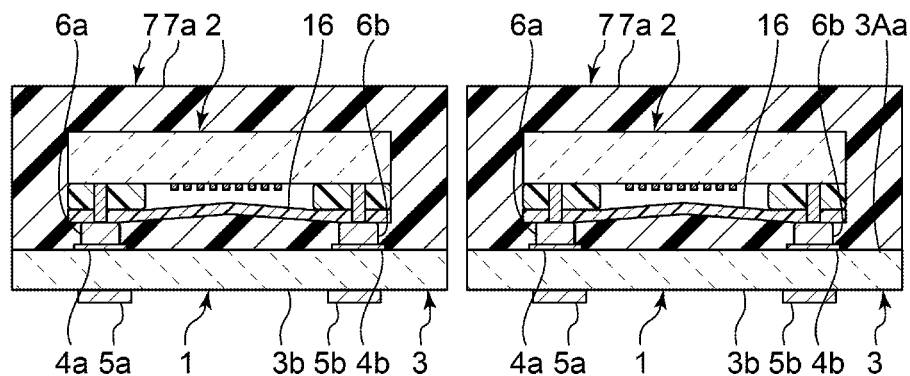

ELASTIC WAVE DEVICE AND METHOD OF MANUFACTURING THE SAME

CROSS REFERENCE TO RELATED APPLICATIONS

This application claims the benefit of priority to Japanese Patent Application No. 2015-051813 filed on Mar. 16, 2015 and is a Continuation Application of PCT Application No. PCT/JP2016/055244 filed on Feb. 23, 2016. The entire contents of each application are hereby incorporated herein by reference.

BACKGROUND OF THE PRESENT INVENTION

1. Field of the Invention

The present invention relates to an elastic wave device including an elastic wave element with a WLP (Wafer Level Package) structure that is mounted above a mounting substrate.

2. Description of the Related Art

Conventionally, elastic wave devices each including an elastic wave element having a WLP structure that is mounted above a mounting substrate are in widespread use in, for example, cellular phones.

In an elastic wave device disclosed in Japanese Unexamined Patent Application Publication No. 2010-278971, an elastic wave element above a mounting substrate is sealed with a sealing resin.

Ideally, mounting substrates are flat. In fact, however, many mounting substrates have non-uniform thicknesses for various reasons. A mounting substrate including a portion on which an internal wiring is installed and a portion on which no internal wiring is installed may have a non-uniform thickness as in the case of the mounting substrate in Japanese Unexamined Patent Application Publication No. 2010-278971. In recent years, there has been a requirement for the size of elastic wave devices to be further decreased. The thickness of the mounting substrates is accordingly decreased. For this reason, the mounting substrates are likely to warp.

In the case where the elastic wave element is mounted above such a mounting substrate and then sealed with a resin, the degree of parallelism between the upper surface of a sealing resin and the lower surface of the mounting substrate and between the upper surface of the sealing resin and a terminal electrode may not be good. Accordingly, a failure in contact between an inspection electrode and the terminal electrode may occur in an inspecting process.

SUMMARY OF THE INVENTION

Preferred embodiments of the present invention provide elastic wave devices in which a degree of parallelism between an upper surface of a sealing resin and a terminal electrode is good and in which a failure in contact between the terminal electrode on a mounting substrate and an inspection electrode is unlikely to occur.

An elastic wave device according to a preferred embodiment of the present invention includes an elastic wave element including a piezoelectric substrate including a first main surface and a second main surface facing the first main surface, an IDT electrode disposed on the second main surface of the piezoelectric substrate, a support disposed on the second main surface of the piezoelectric substrate so as to surround the IDT electrode in plan view from a second main surface side of the piezoelectric substrate, and a cover that is disposed on the support and seals the IDT electrode together with the support and the piezoelectric substrate, a mounting substrate that includes an upper surface above which the elastic wave element is mounted and a lower surface on which a terminal electrode is disposed, and a sealing resin that is disposed on an upper surface side of the mounting substrate and seals the elastic wave element. A thickness of the mounting substrate is less than a thickness of the sealing resin that corresponds to a distance from a surface of the sealing resin in contact with the upper surface of the mounting substrate to a surface of the sealing resin on an opposite side of the mounting substrate.

In an elastic wave device according to a preferred embodiment of the present invention, the cover curves toward a piezoelectric substrate side. In this case, the degree of parallelism between the upper surface of the sealing resin and the terminal electrode is better, and a failure in contact between the terminal electrode on the mounting substrate and an inspection electrode is less likely to occur.

In another elastic wave device according to a preferred embodiment of the present invention, the cover curves more than the mounting substrate. In this case, the degree of parallelism between the upper surface of the sealing resin and the terminal electrode is better, and a failure in contact between the terminal electrode on the mounting substrate and an inspection electrode is less likely to occur.

In another elastic wave device according to a preferred embodiment of the present invention, a volume of the sealing resin is larger than or equal to a volume of the mounting substrate. In this case, the degree of parallelism between the upper surface of the sealing resin and the terminal electrode is better, and a failure in contact between the terminal electrode on the mounting substrate and an inspection electrode is less likely to occur.

In another elastic wave device according to a preferred embodiment of the present invention, the following formula (1) is satisfied:

$$A1 \times T1 - A2 \times T2 \geq A3 \times T3 \ldots \qquad \text{Formula (1)}$$

where, in a plan view from a first main surface side of the piezoelectric substrate, A1 represents an area of the sealing resin, A2 represents an area of the elastic wave element, A3 represents an area of the mounting substrate, and T1 represents the thickness of the sealing resin that corresponds to the distance from the surface of the sealing resin in contact with the upper surface of the mounting substrate to the surface of the sealing resin on the opposite side of the mounting substrate, T2 represents a thickness of the elastic wave element, and T3 represents a thickness of the mounting substrate. In this case, the degree of parallelism between the upper surface of the sealing resin and the terminal electrode is better, and a failure in contact between the terminal electrode on the mounting substrate and an inspection electrode is less likely to occur.

In another elastic wave device according to a preferred embodiment of the present invention, the thickness of the elastic wave device is about 1 mm or less, the thickness of the mounting substrate is about 0.5 mm or less, and an occupancy ratio of the thickness of the mounting substrate to the thickness of the elastic wave device is about 45% or less, for example. In this case, the degree of parallelism between the upper surface of the sealing resin and the terminal electrode is able to be more surely improved, and a failure in contact between the terminal electrode on the mounting substrate and an inspection electrode is less likely to occur.

In another elastic wave device according to a preferred embodiment of the present invention, the thickness of the mounting substrate is about 0.2 mm or less, for example. In this case, the degree of parallelism between the upper surface of the sealing resin and the terminal electrode is able to be more surely improved, and a failure in contact between the terminal electrode on the mounting substrate and an inspection electrode is less likely to occur.

In another elastic wave device according to a preferred embodiment of the present invention, the elastic wave element is joined to the mounting substrate by using a bump. In this case, the elastic wave element is able to be successfully mounted above the mounting substrate.

A method of manufacturing an elastic wave device according to a preferred embodiment of the present invention includes a step of preparing elastic wave elements each including a piezoelectric substrate including a first main surface and a second main surface facing the first main surface, an IDT electrode disposed on the second main surface of the piezoelectric substrate, a support disposed on the second main surface of the piezoelectric substrate so as to surround the IDT electrode in a plan view from a second main surface side of the piezoelectric substrate, and a cover that is disposed on the support and seals the IDT electrode together with the support and the piezoelectric substrate, and a mother mounting substrate that includes an upper surface and a lower surface on which a terminal electrode is disposed, a step of mounting the elastic wave elements above the upper surface of the mother mounting substrate such that the cover and the upper surface of the mother mounting substrate face each other at an interval, a step of disposing the mother mounting substrate, after the elastic wave elements have been mounted above the upper surface of the mother mounting substrate, in an interior space defined by a first mold and a second mold, a step of supplying a fluid sealing resin to the interior space and onto the upper surface of the mother mounting substrate so as to seal the elastic wave elements while pressurizing the sealing resin until each cover has curved toward a piezoelectric substrate side, a step of curing the sealing resin, and a step of dividing the mother mounting substrate and the sealing resin into individual pieces. In this case, the degree of parallelism between the upper surface of the sealing resin and the terminal electrode is better, and a failure in contact between the terminal electrode on the mounting substrate and an inspection electrode is less likely to occur.

In a method of manufacturing an elastic wave device according to a preferred embodiment of the present invention, when the sealing resin is pressurized until each cover has curved toward the piezoelectric substrate side, an inner wall surface of the interior space flattens the mother mounting substrate. In this case, the degree of parallelism between the upper surface of the sealing resin and the terminal electrode is better, and a failure in contact between the terminal electrode on the mounting substrate and an inspection electrode is less likely to occur.

Preferred embodiments of the present invention provide elastic wave devices in which the degree of parallelism between the upper surface of the sealing resin and the terminal electrode is good and in which a failure in contact between the terminal electrode on the mounting substrate and an inspection electrode is unlikely to occur, and methods of manufacturing the elastic wave devices.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2C are front sectional diagrams illustrating a method of manufacturing elastic wave devices according to the first preferred embodiment of the present invention.

DETAILED DESCRIPTION OF THE PREFERRED EMBODIMENTS

Preferred embodiments of the present invention will hereinafter be described in detail with reference to the drawings to clarify the present invention.

The preferred embodiments are described by way of example in the present disclosure. The features of various preferred embodiments of the present invention can be partially replaced or combined.

Figure 1:
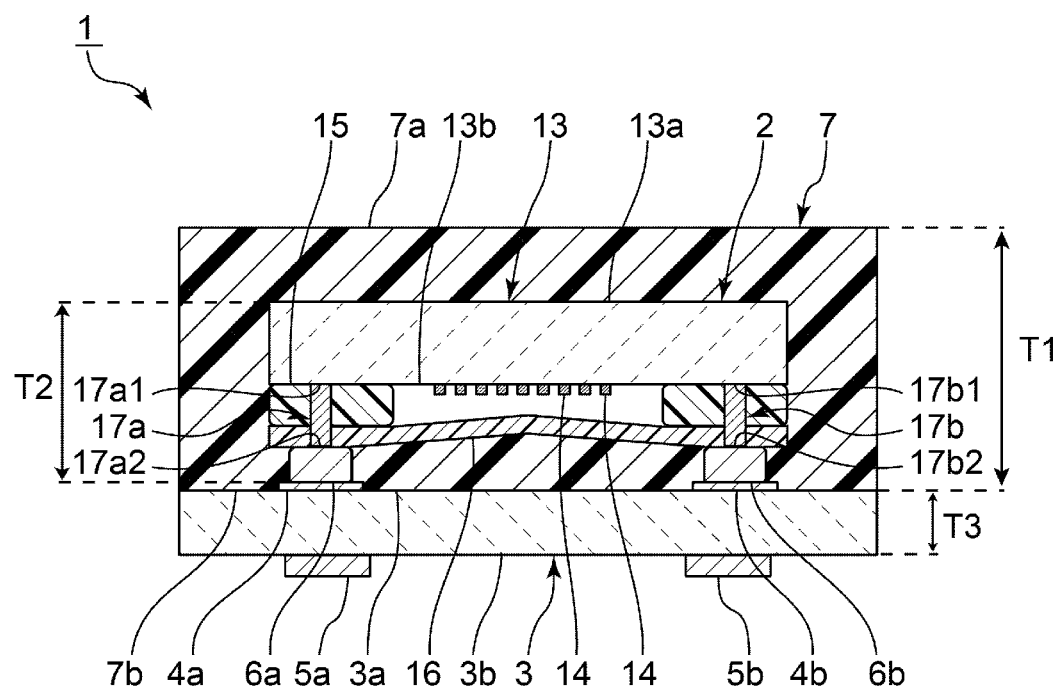
FIG. 1 is a front sectional view of an elastic wave device according to a first preferred embodiment of the present invention.

FIG. 1 is a front sectional view of an elastic wave device according to a first preferred embodiment of the present invention.

An elastic wave device 1 includes a mounting substrate 3. The mounting substrate 3 includes an upper surface 3a and a lower surface 3b that face each other. The material of the mounting substrate 3 is not particularly limited and may be, for example, a proper ceramic, or a resin including a glass epoxy resin.

Electrode lands 4a and 4b are disposed on the upper surface 3a of the mounting substrate 3. Terminal electrodes 5a and 5b to be electrically connected to the outside are disposed on the lower surface 3b. The electrode lands 4a and 4b and the terminal electrodes 5a and 5b are electrically connected to the mounting substrate 3, although this is not illustrated.

An elastic wave element 2 is mounted above the upper surface 3a of the mounting substrate 3. More specifically, the elastic wave element 2 is joined to the electrode lands 4a and 4b by using bumps 6a and 6b. The bumps 6a and 6b are made of a metal such as solder.

The elastic wave element 2 includes a piezoelectric substrate 13. The piezoelectric substrate 13 includes a first main surface 13a and a second main surface 13b that face each other. The piezoelectric substrate 13 is made of, for example, piezoelectric single crystal or piezoelectric ceramics. The elastic wave element 2 is mounted above the mounting substrate 3 from the side of the second main surface 13b of the piezoelectric substrate 13.

IDT electrodes 14 are disposed on the second main surface 13b of the piezoelectric substrate 13. Elastic waves are excited by applying an alternating voltage to the IDT electrodes 14. A support 15 is disposed on the second main surface 13b so as to surround the IDT electrodes 14 in plan view from the side of the second main surface 13b. A cover 16 is disposed on the support 15. The IDT electrodes 14 are sealed by the piezoelectric substrate 13, the support 15, and the cover 16. The cover 16 curves at a central portion thereof toward the side of the piezoelectric substrate 13.

Under-bump metallic layers 17a and 17b are provided through the support 15 and the cover 16. The under-bump metallic layers 17a and 17b include first end portions 17a1 and 17b1 and second end portions 17a2 and 17b2, respectively. The first end portions 17a1 and 17b1 extend to the piezoelectric substrate 13. The second end portions 17a2 and 17b2 are connected to the bumps 6a and 6b, respectively. The under-bump metallic layers 17a and 17b and the IDT electrodes 14 are electrically connected to each other, although this is not illustrated. Accordingly, the elastic wave element 2 is electrically connected to the outside with the bumps 6a and 6b, the electrode lands 4a and 4b, inner electrodes of the mounting substrate 3, and the terminal electrodes 5a and 5b interposed therebetween.

A sealing resin 7 is disposed on the upper surface 3a of the mounting substrate 3. The sealing resin 7 seals the elastic wave element 2. The sealing resin 7 includes an upper surface 7a and a lower surface 7b that is on the side of the mounting substrate 3. The thickness of the mounting substrate 3 is less than the thickness of the sealing resin 7. The thickness of the sealing resin, described here, corresponds to a distance from the surface of the sealing resin in contact with the upper surface of the mounting substrate to the surface of the sealing resin on the opposite side of the mounting substrate.

One of the unique features of the present preferred embodiment is that the thickness of the mounting substrate 3 is less than the thickness of the sealing resin 7. Thus, the degree of parallelism between the upper surface 7a of the sealing resin 7 and the terminal electrodes 5a and 5b is improved, and a failure in contact between the terminal electrodes 5a and 5b on the mounting substrate 3 and an inspection electrode is unlikely to occur. This will now be described together with a manufacturing method according to a preferred embodiment of the present invention.

FIGS. 2A to 2C are front sectional diagrams illustrating a method of manufacturing elastic wave devices according to the first preferred embodiment.

As illustrated in FIG. 2A, plural elastic wave elements 2A are prepared. Each of the elastic wave elements 2A preferably has the same structure as the elastic wave element 2 except that covers 16A do not curve. A mother mounting substrate 3A including an upper surface 3Aa and a lower surface 3Ab is also prepared. The electrode lands 4a and 4b are disposed on the upper surface 3Aa of the mother mounting substrate 3A. The terminal electrodes 5a and 5b are disposed on the lower surface 3Ab of the mother mounting substrate 3A. A substrate having a thickness less than the thickness of a sealing resin, described later, is used as the mother mounting substrate 3A.

The mother mounting substrate 3A curves toward the side of the upper surface 3Aa so as to be convex. Ideally, the mother mounting substrate 3A does not curve but actually curves in many cases. The thinner the mother mounting substrate 3A, the more likely the mother mounting substrate 3A curves.

The elastic wave elements 2A are subsequently mounted above the upper surface 3Aa of the mother mounting substrate 3A. The elastic wave elements 2A are mounted such that the upper surface 3Aa of the mother mounting substrate 3A and the covers 16A of the elastic wave elements 2A face each other at an interval. At this time, the elastic wave elements 2A are joined to the electrode lands 4a and 4b of the mother mounting substrate 3A by using the bumps 6a and 6b. Thus, the elastic wave elements 2A and the mother mounting substrate 3A are electrically connected to each other.

As illustrated in FIG. 2B, a sealing resin 7A is disposed on the side of the upper surface 3Aa of the mother mounting substrate 3A so as to cover the elastic wave elements 2A and thus seals the elastic wave elements 2A. A mold X is used for sealing. The mold X includes first and second molds X1 and X2. The first mold X1 includes an inner wall surface X1a. The second mold X2 includes an inner wall surface X2a. When the mold X is clamped, the first mold X1 is placed on the second mold X2 such that the inner wall surface X1a and the inner wall surface X2a face each other. Consequently, an interior space is defined in the mold X. At this time, the inner wall surface X1a of the first mold X1 and the inner wall surface X2a of the second mold X2 extend in parallel or substantially in parallel with each other.

When the elastic wave elements 2A are sealed, the mother mounting substrate 3A and the elastic wave elements 2A are placed on the inner wall surface X2a of the second mold X2 from the side of the lower surface 3Ab of the mother mounting substrate 3A. At this time, at least a portion of the lower surface 3Ab of the mother mounting substrate 3A or each of the terminal electrodes 5a and 5b is in contact with the inner wall surface X2a of the second mold X2. The mold X is subsequently clamped. The sealing resin 7A is subsequently injected into the interior space of the mold X. When injected, the sealing resin 7A is pressurized because the fluid of the sealing resin 7A is not high. The sealing resin 7A may be heated to increase the fluid of the sealing resin 7A as needed.

In the method of manufacturing elastic wave devices according to the first preferred embodiment, the sealing resin 7A is supplied to the interior space of the mold X while being pressurized until the covers of the elastic wave elements have curved toward the piezoelectric substrate side. The thickness of the sealing resin 7A is more than the thickness of the mother mounting substrate 3A, as described above. Accordingly, pressure is able to be effectively applied to the sealing resin 7A. Such pressurization causes the mother mounting substrate 3A to be pressed toward the side of the lower surface 3Ab. Thus, the mother mounting substrate 3A is able to be formed in a shape following the inner wall surface X2a of the second mold X2 on the side of the lower surface 3Ab, and a curved shape is able to be flattened. The mother mounting substrate 3A is pressed such that the terminal electrodes 5a and 5b come into contact with the second mold X2, and accordingly, the terminal electrodes 5a and 5b are able to be arranged along the second mold X2. The upper surface 7Aa of the sealing resin 7A is formed in a shape following the first mold X1, and accordingly, the upper surface 7Aa is able to be flattened. At this time, the elastic wave elements 2 include curved covers 16.

In the preferred embodiment illustrated in FIG. 2B, the mother mounting substrate 3A is able to be flattened, and this preferred embodiment is more preferable. The mother mounting substrate 3A is not necessarily flattened. The mother mounting substrate 3A may curve.

The covers 16A illustrated in FIG. 2B do not necessarily curve. However, in the case where the sealing resin 7A is pressurized until the covers 16A have curved, the mother mounting substrate 3A is able to be more surely flattened.

The sealing resin 7A is subsequently cured. As illustrated in FIG. 2C, the mother mounting substrate 3A and the sealing resin 7A are subsequently divided in, for example, a step of cutting with a dicing machine. Thus, the elastic wave devices 1 is able to be obtained. The lower surface 3b of the mounting substrate 3 of each elastic wave device 1 is flattened by the above-described pressurization. The lower surface 3b of the mounting substrate 3 and the upper surface 7a of the sealing resin 7 are formed in shapes following the inner wall surface X1a of the first mold X1 and the inner wall surface X2a of the second mold X2 that extend in parallel or substantially in parallel as illustrated in FIG. 2B. Accordingly, the degree of parallelism between the lower surface 3b of the mounting substrate 3 and the upper surface 7a of the sealing resin 7 is improved.

In the case of obtaining an elastic wave device in a manner in which a sealing resin is insufficiently pressurized during injection of the sealing resin, there is a problem in that a mounting substrate does not follow the inner wall surface of a mold and greatly curves. Accordingly, the degree of parallelism between the lower surface of the mounting substrate and the upper surface of the sealing resin is not good. Consequently, the degree of parallelism between terminal electrodes on the lower surface of the mounting substrate and the upper surface of the sealing resin is also not good.

The terminal electrodes 5a and 5b on the lower surface 3b of the mounting substrate 3 are used in inspection to select the elastic wave device 1 illustrated FIG. 1. The inspection is performed in a manner in which an inspection electrode is brought into contact with the terminal electrodes 5a and 5b. At this time, in the case where the degree of parallelism between surfaces of the terminal electrodes and the upper surface of the sealing resin is not good, a failure in contact between the terminal electrodes and the inspection electrode is likely to occur. More specifically, the terminal electrodes substantially incline with respect to a plane including the upper surface of the sealing resin. Accordingly, it is difficult for areas of contact between the terminal electrodes and the inspection electrode to be increased. In addition, in many cases, the positions of the terminal electrodes in the width direction of the elastic wave device are misaligned. Accordingly, in many cases, a failure in contact occurs when the terminal electrodes are simultaneously brought into contact with the inspection electrode, and consequently, reinspection is performed.

In contrast, in the present preferred embodiment, the degree of parallelism between the lower surface 3b of the mounting substrate 3 and the upper surface 7a of the sealing resin 7 is good. In addition, the degree of parallelism between the terminal electrodes 5a and 5b and the upper surface 7a of the sealing resin 7 is good. Accordingly, a failure in contact between the terminal electrodes 5a and 5b and an inspection electrode is unlikely to occur. Reinspection is rarely needed, and accordingly, the productivity is improved.

The mounting substrate most preferably does not curve but may curve. In this case, the mounting substrate preferably curves less than the cover. The degree of curvature of the cover and the mounting substrate is obtained by taking the curvature of each curved portion of the cover and the mounting substrate.

When the curvature of the curved portion of the cover and the curvature of the curved portion of the mounting substrate are measured, the elastic wave device is cut at multiple positions in the width direction. The curvatures of the curved portions of the cover and the mounting substrate that are exposed from the section of cut portions are subsequently measured. The maximum curvature of the measured curvatures is regarded as the degree of curvature, and the degree of curvature may be compared.

In the case where the mounting substrate curves less than the cover, the same effects as in the first preferred embodiment are achieved. An example of this will now be described.

Figure 3:
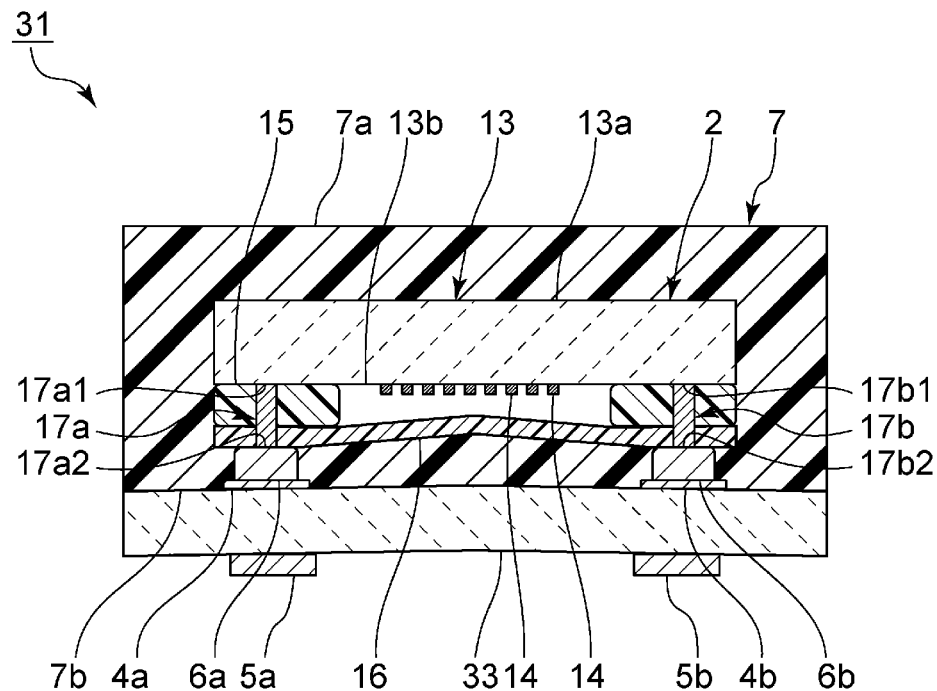
FIG. 3 is a front sectional view of an elastic wave device according to a first modification to the first preferred embodiment of the present invention.

In an elastic wave device 31 according to a first modification of a preferred embodiment of the present invention illustrated in FIG. 3, a mounting substrate 33 curves toward the side of the elastic wave element 2. The mounting substrate 33 curves less than the cover 16.

Figure 4:
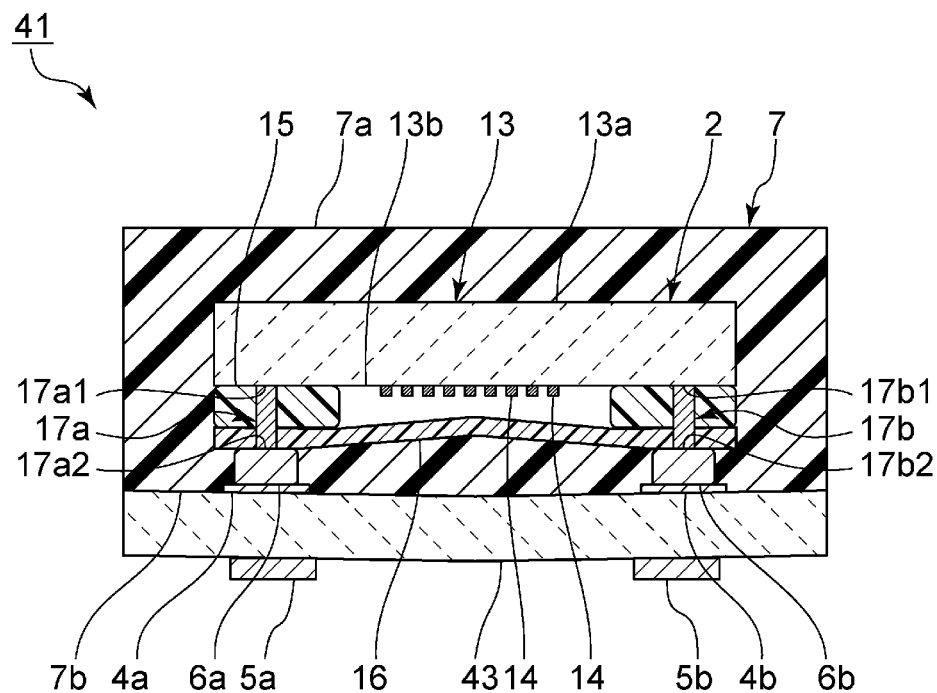
FIG. 4 is a front sectional view of an elastic wave device according to a second modification to the first preferred embodiment of the present invention.

In an elastic wave device 41 according to a second modification of a preferred embodiment of the present invention illustrated in FIG. 4, a mounting substrate 43 curves toward the opposite side of the elastic wave element 2. The mounting substrate 43 curves less than the cover 16.

Referring back to FIG. 1, the volume of the sealing resin 7 of the elastic wave device 1 is preferably larger than or equal to the volume of the mounting substrate 3. Here, in plan view from the side of the first main surface 13a of the piezoelectric substrate 13 of the elastic wave element 2, A1 represents the area of the sealing resin 7, A2 represents the area of the elastic wave element 2, and A3 represents the area of the mounting substrate 3. T1 represents the thickness of the sealing resin 7, T2 represents the thickness of the elastic wave element 2, and T3 represents the thickness of the mounting substrate 3. In this case, the following formula (1) is preferably satisfied:

$$A1 \times T1 - A2 \times T2 \geq A3 \times T3. \tag{Formula (1)}$$

In a resin molding step illustrated in FIG. 2B, the elastic wave element 2A is preferably sealed with the sealing resin 7A such that the sealing resin 7 and the mounting substrate 3 after the dividing step satisfy the relation of the formula (1). Thus, the sealing resin 7A is able to be effectively pressurized in the step illustrated in FIG. 2B, and the mother mounting substrate 3A is able to be more surely flattened. Consequently, in the elastic wave device 1 after the dividing step, the degree of parallelism between the lower surface 3b of the mounting substrate 3 and the upper surface 7a of the sealing resin 7 and between the terminal electrodes 5a and 5b and the upper surface 7a of the sealing resin 7 is good. In the case where the cover of the elastic wave element curves or the mounting substrate is tapered in the width direction, and the values of the thicknesses are distributed, the median of the distribution of the thicknesses may be used as the thicknesses T2 and T3.

The thickness of the elastic wave device 1 according to the present preferred embodiment is, but not limited to, about 1 mm or less, for example. In this case, the thickness of the mounting substrate 3 is preferably about 0.5 mm or less, and an occupancy ratio of the thickness of the mounting substrate 3 to the thickness of the elastic wave device 1 is preferably about 45% or less, for example. In this case, the mother mounting substrate 3A illustrated in FIG. 2B is also thin. Accordingly, the mother mounting substrate 3A is likely to be deformed, and the mother mounting substrate 3A is easily formed in a shape following the second mold X2. The thickness of the mounting substrate 3 is more preferably about 0.4 mm or less, for example. The thickness of the mounting substrate 3 is further preferably about 0.3 mm or less, for example. The thickness of the mounting substrate 3 is most preferably about 0.2 mm or less, for example. In the case of using the mounting substrate 3 having a thickness of about 0.2 mm or less, for example, which is generally not used as the mounting substrate of the elastic wave device 1, the mounting substrate 3 having relatively high flexibility is obtained. When this mounting substrate 3 is used, the flexibility of the mounting substrate 3 affects the terminal electrodes so as not to impede the displacement of the terminal electrodes. Accordingly, when the arrangement of the terminal electrodes disposed on the lower surface of the mounting substrate 3 is changed to a flat arrangement, the flatness of the terminal electrodes is particularly effectively improved.

As the thickness of the mounting substrate 3 decreases, the degree of parallelism between the lower surface 3b of the mounting substrate 3 and the upper surface 7a of the sealing resin 7 is able to be more surely improved. The degree of parallelism between the terminal electrodes 5a and 5b and the upper surface 7a of the sealing resin 7 is also able to be more surely improved. Accordingly, a failure in contact between the terminal electrodes 5a and 5b and an inspection electrode is less likely to occur. In addition, the size of the elastic wave device is able to be decreased. From the perspective of the strength of the elastic wave device 1, the thickness of the mounting substrate 3 is preferably about 0.1 mm or more, for example.

In the case where the elastic wave device 1 is mounted on a substrate of a module device, a step of disposing the elastic wave device 1 at a predetermined position while holding the upper surface of the elastic wave device 1 by suction is generally used. When suction, the elastic wave element may be damaged due to a stress applied to the elastic wave element. In view of this, a ratio of the thickness of the sealing resin covering the upper surface of the elastic wave element to the thickness of the sealing resin located between the lower surface of the elastic wave element and the mounting substrate 3 is preferably determined to be 1 or more. This enables the stress applied to the elastic wave element to be decreased while maintaining the height of a sealed portion of the elastic wave device 1 when suction.

In the present preferred embodiment, since the degree of parallelism between the terminal electrodes 5a and 5b and an inspection electrode is good, the areas of contact between the terminal electrodes 5a and 5b and the inspection electrode are able to be readily increased. Accordingly, even when the size of the elastic wave device is decreased, a failure in contact between the terminal electrodes 5a and 5b and the inspection electrode is unlikely to occur.

Ideally, the thickness of the mounting substrate is uniform. In fact, however, the thickness is non-uniform in many cases. In the case where the mounting substrate includes an internal wiring, for example, there are a portion on which the internal wiring is disposed and a portion on which no internal wiring is disposed. This may cause the thickness of the mounting substrate to be non-uniform.

Figure 5:
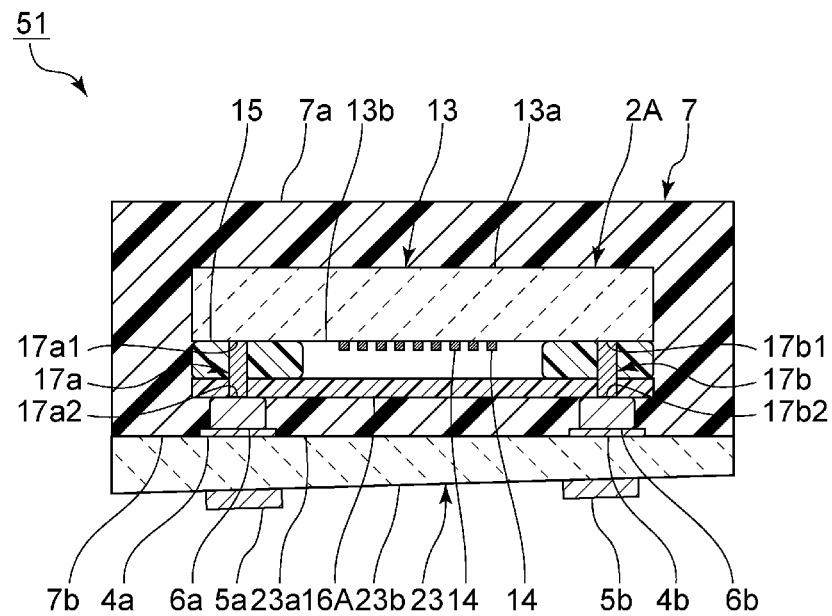
FIG. 5 is a front sectional view of an elastic wave device in a comparative example.

FIG. 5 illustrates a comparative example in which the thickness of a mounting substrate 23 is non-uniform. In an elastic wave device 51, the degree of parallelism between the upper surface 7a of the sealing resin 7 and the upper surface 23a of the mounting substrate 23 is good. However, the degree of parallelism between the upper surface 7a of the sealing resin 7 and the lower surface 23b of the mounting substrate 23 is not good. The degree of parallelism between the upper surface 7a of the sealing resin 7 and the terminal electrodes 5a and 5b is also not good. Accordingly, a failure in contact between the terminal electrodes 5a and 5b and an inspection electrode is likely to occur.

In contrast, in an elastic wave device according to a second preferred embodiment described below, the same effects as in the elastic wave device 1 according to the first preferred embodiment are able to be achieved even when the thickness of the mounting substrate is non-uniform.

Figure 6:
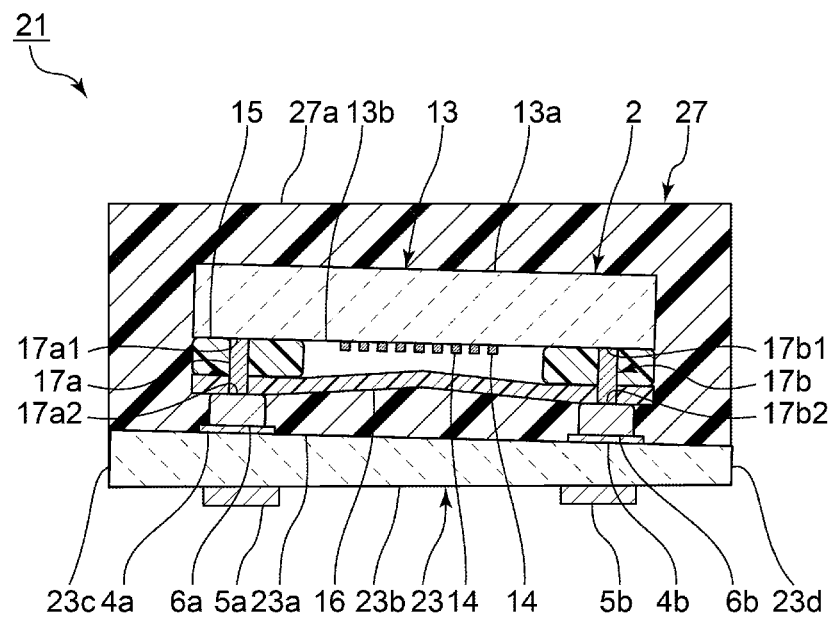
FIG. 6 is a front sectional view of an elastic wave device according to a second preferred embodiment of the present invention.

FIG. 6 is a front sectional view of the elastic wave device according to the second preferred embodiment of the present invention.

In an elastic wave device 21, the thickness of the mounting substrate 23 is non-uniform. The elastic wave element 2 inclines with respect to the upper surface 27a of a sealing resin 27. The elastic wave device 21 has the same structure as in the elastic wave device 1 according to the first preferred embodiment except for these points.

The mounting substrate 23 includes first and second end surfaces 23c and 23d that face each other. In the mounting substrate 23, the thickness at the second end surface 23d is less than the thickness at the first end surface 23c. In this case, the degree of parallelism between the lower surface 23b of the mounting substrate 23 and the upper surface 27a of the sealing resin 27 is good as in the first preferred embodiment. The degree of parallelism between the terminal electrodes 5a and 5b and the upper surface 27a of the sealing resin 27 is also good.

The elastic wave device 21 is able to be obtained in the same manner as the method of manufacturing the elastic wave devices 1 according to the first preferred embodiment. More specifically, as illustrated in FIG. 2B, the sealing resin is injected while being pressurized until the covers have curved. Thus, the mother mounting substrate is able to be arranged along the mold on the second main surface side. The terminal electrodes 5a and 5b is also able to be arranged along the mold. This allows for the elastic wave device 21 in which the degree of parallelism between the lower surface 23b of the mounting substrate 23 and the upper surface 27a of the sealing resin 27 and between the terminal electrodes 5a and 5b and the upper surface 27a of the sealing resin 27 is good.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an elastic wave element including a piezoelectric substrate including a first main surface and a second main surface facing the first main surface, an IDT electrode disposed on the second main surface of the piezoelectric substrate, a support disposed on the second main surface of the piezoelectric substrate so as to surround the IDT electrode in a plan view from a second main surface side of the piezoelectric substrate, and a cover that is disposed on the support and seals the IDT electrode together with the support and the piezoelectric substrate;
   a mounting substrate that includes an upper surface above which the elastic wave element is mounted and a lower surface on which a terminal electrode is disposed; and
   a sealing resin that is disposed on an upper surface side of the mounting substrate and seals the elastic wave element; wherein
   a thickness of the mounting substrate is less than a thickness of the sealing resin that corresponds to a distance from a surface of the sealing resin in contact with the upper surface of the mounting substrate to a surface of the sealing resin on an opposite side of the mounting substrate; and
   the cover curves toward a piezoelectric substrate side.

2. The elastic wave device according to claim 1, wherein the cover curves more than the mounting substrate.

3. The elastic wave device according to claim 1, wherein a volume of the sealing resin is larger than or equal to a volume of the mounting substrate.

4. The elastic wave device according to claim 1, wherein a formula $$A1 \times T1 - A2 \times T2 \geq A3 \times T3$$

is satisfied, and in a plan view from a first main surface side of the piezoelectric substrate, A1 represents an area of the sealing resin, A2 represents an area of the elastic wave element, A3 represents an area of the mounting substrate, and T1 represents the thickness of the sealing resin that corresponds to the distance from the surface of the sealing resin in contact with the upper surface of the mounting substrate to the surface of the sealing resin on the opposite side of the mounting substrate, T2 represents a thickness of the elastic wave element, and T3 represents the thickness of the mounting substrate.

5. The elastic wave device according to claim 1, wherein a thickness of the elastic wave device is about 1 mm or less, the thickness of the mounting substrate is about 0.5 mm or less, and an occupancy ratio of the thickness of the mounting substrate to the thickness of the elastic wave device is about 45% or less.

6. The elastic wave device according to claim 5, wherein the thickness of the mounting substrate is about 0.2 mm or less.

7. The elastic wave device according to claim 1, wherein the elastic wave element is joined to the mounting substrate by a bump.

8. The elastic wave device according to claim 1, further comprising under-bump metallic layers extending through the support and the cover.

9. The elastic wave device according to claim 1, wherein the mounting substrate has a convex shape.

10. The elastic wave device according to claim 1, wherein the mounting substrate curves toward the elastic wave element.

11. The elastic wave device according to claim 10, wherein the mounting substrate curves less than the cover.

12. The elastic wave device according to claim 1, wherein the mounting substrate curves away from the elastic wave element.

13. The elastic wave device according to claim 12, wherein the mounting substrate curves less than the cover.

14. The elastic wave device according to claim 1, wherein the thickness of the mounting substrate is non-uniform.

15. The elastic wave device according to claim 1, wherein the elastic wave element inclines with respect to an upper surface of the sealing resin.

16. The elastic wave device according to claim 1, wherein the mounting substrate includes first and second end surfaces that face each other, and a thickness at the second end surface is less than a thickness at the first end surface.

17. The elastic wave device according to claim 1, wherein the thickness of the mounting substrate is about 0.1 mm to about 0.5 mm.

* * * * *